(12) United States Patent
Joos

(10) Patent No.: US 11,289,893 B2
(45) Date of Patent: Mar. 29, 2022

(54) DEVICES, SYSTEMS AND METHODS FOR AVOIDING FAULT PROPAGATION IN SAFETY SYSTEMS

(71) Applicant: SEMICONDUCTOR COMPONENTS INDUSTRIES, LLC, Phoenix, AZ (US)

(72) Inventor: Dieter Jozef Joos, Belgium (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 54 days.

(21) Appl. No.: 16/718,484

(22) Filed: Dec. 18, 2019

(65) Prior Publication Data
US 2021/0194237 A1    Jun. 24, 2021

(51) Int. Cl.
*H02H 3/08* (2006.01)
*H01L 27/02* (2006.01)

(52) U.S. Cl.
CPC ........... *H02H 3/08* (2013.01); *H01L 27/0248* (2013.01); *H01L 27/0255* (2013.01)

(58) Field of Classification Search
CPC ....................................................... H02H 3/08
See application file for complete search history.

(56) References Cited

U.S. PATENT DOCUMENTS 6,303,875 B1 * 10/2001 Hata ...................... H05K 1/111
174/260
6,570,531 B1 * 5/2003 Stratton ................... G01S 19/15
342/357.53
2011/0038083 A1 * 2/2011 Coln ..................... H01L 27/0255
361/54

(Continued)

FOREIGN PATENT DOCUMENTS

| EP | 3151123 A1 | 4/2017 |
|---|---|---|
| WO | 2013144001 A1 | 10/2013 |

OTHER PUBLICATIONS

Kurt Shuler, "The ABCs of ISO 26262", Dec. 18, 2014, pp. 1-17, downloaded from the Internet at https://semiengineering.com/the-abcs-of-iso-26262/.

(Continued)

*Primary Examiner* — Peter M Novak
(74) *Attorney, Agent, or Firm* — Wash Park IP Ltd.; John T. Kennedy

(57) ABSTRACT

The various embodiments of the present disclosure are directed to devices, systems and methods for mitigating fault propagation between two or more safety components. A system, for avoiding propagation of a fault between two or more safety components may include a control unit outputting an input signal, a first safety component electrically coupled to receive the input signal from the control unit; a second safety component electrically coupled to receive the input signal from the control unit; and a first isolating component electrically disposed between and further coupling the control unit with the first safety component. Each of the first safety component and the second safety component are electrically coupled to the control unit by at least a common lead. The first isolating component prevents a first IC fault arising with respect to the first safety component from propagating, via the input signal, to the second safety component.

18 Claims, 8 Drawing Sheets

(56) References Cited

U.S. PATENT DOCUMENTS

| | | |
|---|---|---|
| 2011/0142112 A1* | 6/2011 | Lin .................... H04L 7/0008 |
| | | 375/224 |
| 2012/0139549 A1 | 6/2012 | Sufrin-Disler et al. |
| 2015/0124363 A1 | 5/2015 | Garbossa |
| 2015/0304648 A1 | 10/2015 | Gulati |
| 2015/0331040 A1 | 11/2015 | Bernon-Enjalbert et al. |
| 2016/0284429 A1* | 9/2016 | Remley .................. G21C 7/36 |
| 2020/0343009 A1* | 10/2020 | Clarkson ............... G21D 3/001 |

OTHER PUBLICATIONS

John Favaro, "Experience with ISO26262 ASIL Decomposition", "http://www.aAutomotive SPIN", Feb. 17, 2011, pp. 1-27, downloaded from the Internet at http://www.automotive-spin.it/uploads/8/8W_favaro.pdf, Published in: Milano Italy.

Jitin George, "C200 MCU SafeTI Control Solutions: An introduction to ASIL decomposition and SIL synthesis", downloaded from the Internet at http://www.ti.com/lit/wp/sway028/sway028.pdr, Apr. 2019, pp. 1-9, Publisher: Texas Instruments, Published in: Dallas, US.

U.S. Appl. No. 17/188,058, filed Mar. 1, 2021.

\* cited by examiner

DEVICES, SYSTEMS AND METHODS FOR AVOIDING FAULT PROPAGATION IN SAFETY SYSTEMS

TECHNICAL FIELD

The technology described herein generally relates to devices, systems, and methods for use in avoiding fault propagation in safety systems. More specifically, the technology described herein generally relates to automotive and other functional safety standards and devices and systems utilized to comply with such standards. Even more specifically, the technology described herein relates to avoiding propagation of fault conditions between two or more safety functions and/or safety mechanisms utilized in motor vehicles, other vehicles and otherwise. The technology described herein also generally relates to device, systems and methods for use in avoiding propagation of faults arising with respect to dependent fault initiators in safety systems.

BACKGROUND

Today, automotive systems need to comply with various functional safety standards. Such standards include the International Organization for Standardization's (ISO) ISO 26262-1:2018 standard and earlier versions thereof. Others standards apply to other forms of vehicles including the SIL standard used for aircraft. Various embodiments of the present description are directed to automotive standards, but, may apply to other standards.

The ISO 26262 standard (herein, the "Standard") is commonly applied to electrical/electronic/programmable electronic ("E/E/PE") components in commonly available passenger vehicles (herein, such E/E/PE components are individually and collectively referred to as a "vehicle system" or "module"). The Standard addresses possible hazards possibly caused by a malfunctioning vehicle system and interactions between two or more of such vehicle systems. A copy of the Standard is available on-line, for purchase, at https://www.iso.org/standard/68383.html.

As is commonly known, the Standard is a risk-based safety standard. The Standard provides for safety of a vehicle, its passengers and others (such as bystanders) by relying on automatic protections operating correctly in response to an error or fault condition (herein, a "fault") in/with a vehicle system and whether such fault can result in a hazardous event if the fault is left uncontrolled and/or otherwise addressed. Examples of hazardous events include, but are not limited to, a motor vehicle accident (herein, a "hazard"). To address, prevent and, to the extent possible, minimize risks arising from faults and hazards, a vehicle system is assessed and one or more safety goals are assigned thereto (such assessments and assignment of safety goals being identified herein as "hazard analysis").

As shown in FIG. 1, hazard analysis includes classifying a potential fault in view of probability of harm versus a severity of harm that may arise if the fault occurred and in view of a controllability of that fault, should it occur. As shown, one or more "measures" may reduce an unacceptable harm to an acceptable harm.

As shown in Table 1 below, the probability of a harm may occur over a probability range from low to high, and is also commonly expressed as an "exposure" (as shown in the "Exposure E" column provided in the table included in FIG. 1). The severity of a harm may occur over a severity range from low to high, where a harm with a high severity may be life threatening (as shown in the "Severity S" column provided in the table included in FIG. 1). The controllability of a harm may occur over a controllability range from high, C1 to low, C3 (as shown in the "Controllability C" columns provided in the table included in FIG. 1). A high controllability C1 rating generally indicates that when a given fault occurs, a response to such fault is "controllable." In contrast, a low controllability rating C3 indicates that should the fault occur, recovery therefrom is uncontrollable. Or, in simple terms, a C3 fault is likely to result in significant injury, including potentially death, to a driver of an automobile or others.

TABLE 1

| Severity (S) | Exposure (E) | Controllability | | |
| --- | --- | --- | --- | --- |
| | | C1 | C2 | C3 |
| S1 | E1 | QM | QM | QM |
| | E2 | QM | QM | QM |
| | E3 | QM | QM | ASIL A |
| | E4 | QM | ASIL A | ASIL B |
| S2 | E1 | QM | QM | QM |
| | E2 | QM | QM | ASIL A |
| | E3 | QM | ASIL A | ASIL B |
| | E4 | ASIL A | ASIL B | ASIL C |
| S3 | E1 | QM | QM | ASIL A |
| | E2 | QM | ASIL A | ASIL B |
| | E3 | ASIL A | ASIL B | ASIL C |
| | E4 | ASIL B | ASIL C | ASIL D |

In short, hazard analysis involves the creation of safety goals and safety measures, which are designed to reduce hazards to an acceptable risk level. Safety measures are accomplished by "safety components" including one more "safety functions" which are monitored by one or more "safety mechanisms." A safety mechanism is essentially one or more validation and/or confirmation measures that are provided to ensure that a given safety goal(s) is accomplished by a given, one or more safety function(s). Each safety function provides a predetermined response that is performed when a fault is detected in a vehicle system. Safety mechanism(s), when failures in one or more safety functions are detected, often result in a vehicle being configured into a "safe state" (also referred to as a "fail safe" state), and/or a functional state that proceeds as a different operating level (often referred to as a "fail functional" state). For example, a "fail safe" state may result in a vehicle being rendered inoperable, and often requiring towing services. A "fail functional" state may result in a vehicle still being operable, albeit at a reduced function, such as one where vehicular speeds over a specific speed are prohibited (until the fault is addressed), where a component is disabled (such as an air bag deployment mechanism being powered down), or otherwise.

To further define such safety goals, safety functions and the safety mechanisms required for any given single point fault, one or more Automotive Safety Integrity Levels (each an "ASIL") may be assigned to one or more of the various vehicle systems. As shown in FIG. 1, the ASIL classification provides a safety goal range from ASIL A to ASIL D (where A is the least strict, and D is the strictest). More specifically, each of these ASIL safety goals specify a single point fault metric (SPFM)—a percentage (%) of faults that are covered by a safety mechanism or not impacting the safety goal, as follows: ASIL B=90%, ASIL C=97%, and ASIL D=99%. For ASIL A no percentage is assigned. As shown in the table provided in FIG. 1, ASIL D faults arise with respect to those faults that have the highest severity rating, the highest exposure rating, and are uncontrollable (i.e., they have a C3 controllability rating—indicating a lack of controllability by a driver should the fault occur).

More specifically, an ASIL D hazardous event is one having a reasonable probability of causing a life-threatening injury, where the injury is physically possible under most operating conditions and with respect to which the driver has little, if any, chance of preventing the injury. An example of an ASIL D event is an uncontrolled/random airbag firing while one is driving the vehicle and the vehicle is not in an accident. An uncontrolled air bag deployment, while a vehicle is moving, may result in severe bodily harm if not death to one or more occupants of the vehicle, or others.

To address ASIL risks, the Standard provides that a given safety goal can be satisfied by "decomposing" (or breaking-down) a risk into subordinate vehicle systems, each of which has a lower ASIL rating. Corresponding safety functions may be accomplished by providing failover to redundant functions, using two independent functions to determine a same parameter (e.g., using a speed sensor and a drive shaft RPM sensor to determine a vehicle's current speed characteristics), or otherwise.

That is, a safety goal can be satisfied by decomposing a safety function (and safety mechanism monitoring thereof) down to one or more safety requirements that are allocated to multiple vehicle systems (each having low risk ratings), thereby avoiding a single point failure hazard.

For example, as shown in FIG. 2, an ASIL D event may be "decomposed" into subordinate vehicle systems that operate at a less critical level, including at a Quality Management (QM) level—a level where a safety measure is not required, as the risk of a hazardous event is not unreasonable. The QM standard is defined in ISO 26262-03:2018 in Note 2 and in section 5.4.5.1. FIG. 2 provides one example of ASIL decomposition. The bold "D" indicates the before decomposition of a superior ASIL level, such as ASIL D, that can be satisfied by two or more subordinate vehicle systems, each having lower ASIL levels, as such an ASIL C rated component combined with an ASIL A rated component, or two ASIL B rated components (such as redundant ASIL B components), or an ASIL D rated component combined with a QM rated component.

In FIG. 3, an illustrative representative of relationships that may be provided between a vehicle system, such as an air bag system 300, a safety function 302 and a safety mechanism 304. As shown, the safety function 302 may include one or more circuits such as an accelerometer 306, a gain stage 308, and an analog to digital (A/D) converter 310. The safety mechanism 304 may monitor one or more of such circuits for proper operation thereof. It is to be appreciated that the accelerometer 306 may be used to determine whether an air bag should deploy (as evidenced by a sudden, drastic de-acceleration of the vehicle) and the safety mechanism 304 may be used to verify that the accelerometer 306 is operating correctly and the safety function, e.g., of a properly operating air bag system not deploying unexpectedly, being ensured. Should any one of these circuits fail as indicated, for example, by a "fault" on a connection inside or between the accelerometer 306 and the gain stage 308, a given safety requirement may be violated (as shown by the dashed line). For an ASIL D requirement, 99% of such faults must be both detected and addressed by appropriate corrective actions (such corrective action(s) being a "response") in order for the vehicle system to comply with the Standard. It is to be appreciated that responses may vary based upon the fault detected and other factors.

It is further to be appreciated that often a vehicle system, such as a hardware module provided by an Integrated Circuit (an "IC") may also be impacted based upon an ASIL rating associated with the components used in providing the IC, such as a die and a "package" used with such die. The ASIL rating of the IC may thus depend on SPFMs associated with each of the die and the package (or other individually identifiable components). Such SPFMs may be expressed mathematically as per Equations 1 and 2 below, where $\lambda$ is probability of a failure-in-time (a "FIT"), expressed as one fault in one (1) billion hours in usage for the vehicle system, "SPF" is a single point failure, and "SR" is a safety related circuitry. $\lambda_{SPF}$ is a value that expresses probability of the number of failures in one (1) billion hours that violates the safety requirement and that remains undetected. $\lambda_{SR}$ is a value that expresses probability of the number of single faults in one (1) billion hours in the safety related part of the electronic system. It is to be appreciated that not all faults in the safety related circuitry lead to a violation of the safety requirement. Further, some implementations often desire conformance with Equations 1 and 2 for both a die and a package.

$$SPFM(\text{die}) = 1 - \frac{\lambda_{SPF,Die}}{\lambda_{SR,Die}} \quad \text{Equation 1}$$

$$SPFM(\text{package}) = 1 - \frac{\lambda_{SPF,Package}}{\lambda_{SR,Package}} \quad \text{Equation 2}$$

It is further to be appreciated, that a package (or other component) may fail based upon a failure of a single element thereof, such a single bonding wire (BW) provided and/or used with a package. Such single point failures may inhibit compliance with one or more AISL ratings. For example, when sixteen (16) BWs are provided with a package, a failure of a single BW may result in a violation of both an ASIL C and an ASIL D requirement. As shown by FIG. 2, ASIL decomposition might thus require the use of ASIL B redundant ICs, or other combinations of components; such combinations may be cost and complexity prohibitive.

Further, system designers commonly seek to avoid dependent faults. A dependent fault is essentially a fault that occurs with respect to one vehicle system that may be common to another vehicle system. Dependent faults may be identified as common cause failures, cascading failures, and otherwise. To address dependent faults and meet ASIL requirements, system designers commonly seek to avoid cause of such dependent faults—dependent failure initiators (DFIs).

Yet, DFIs are not limited to vehicle systems and may occur in safety components themselves. That is, a single point failure in a signal provided to each of a safety function and a safety mechanism may result in a DFI that disables, or otherwise results in an undesired response, in one or more of the safety function and a safety mechanism. For example, a propagated fault in a control input signal, such as a clock, reset, supply, reference voltage, bias current, or otherwise that is provided to each of a safety function and a safety mechanism may result in a DFI in the safety component(s) used for one or more vehicle systems (modules, per FIG. 3). Yet, the avoidance of such propagated DFIs in safety components remains unaddressed by currently available devices, systems and methods. Accordingly, devices, systems and methods which avoid fault propagation and propagated DFIs in safety components are needed and provided by the various embodiments of the present disclosure.

SUMMARY

The various embodiments of the present disclosure describe devices, systems, and methods for avoiding fault propagation and dependent failure initiation in safety systems.

In accordance with at least one embodiment of the present disclosure a system, for avoiding propagation of a fault to a safety component, may include a control unit outputting an input signal; a first component electrically coupled to receive the input signal from the control unit; a safety component electrically coupled to receive the input signal from the control unit; and a first isolating component electrically disposed between and further coupling the control unit with the first component. For at least one embodiment, each of the first component and the safety component may be electrically coupled to the control unit by at least a common lead. For at least one embodiment, the first isolating component may be configured to prevent a first IC fault arising with respect to the first component from propagating, via the input signal, to the safety component.

For at least one embodiment, a system for avoiding propagation of a fault to a safety component may include use of a first component configured to provide a first safety function and a safety component configured to provide a first safety mechanism.

For at least one embodiment, a system for avoiding propagation of a fault to a safety component may include use of a first component configured provide a first safety function and a safety component configured to provide a second safety function.

For at least one embodiment, a system for avoiding propagation of a fault to a safety component may include use of a first component configured to provide a first safety mechanism and a safety component configured to provide a second safety mechanism.

For at least one embodiment, a system for avoiding propagation of a fault to a safety component may include use of a first isolating component that includes a current isolating component.

For at least one embodiment, a system for avoiding propagation of a fault to a safety component may include use of a first isolating component that includes a voltage isolating component.

For at least one embodiment, a system for avoiding propagation of a fault to a safety component may include use of a second isolating component electrically disposed between and further coupling a control unit with a safety component. For at least one embodiment, the second isolating component may be configured to prevent a second IC fault arising with respect to the safety component from propagating, via an input signal, to the first component. As described below and used herein, "first IC fault" is used to identify a fault arising with respect to a first IC or a first non-safety component and "second IC fault" is used to identify a fault arising with respect to a second IC or a second non-safety component.

For at least one embodiment, a system for avoiding propagation of a fault to a safety component may include use of a first isolating component and a second isolating component which are configured as current isolating components having substantially identical impedances.

For at least one embodiment, a system for avoiding propagation of a fault to a safety component may be configured to operate such that a first IC fault results in an insubstantial change in an input signal as provided to the safety component and a second IC fault results in an insubstantial change in the input signal as provided to the first component.

For at least one embodiment, a system for avoiding propagation of a fault to a safety component may be configured to operate such that when at least one of first IC fault and the second IC fault comprises a short-circuit fault, during the short-circuit fault, a voltage potential of an input signal provided to a non-faulting safety component is between seventy-five percent (75%) and one-hundred percent (100%) of an output voltage potential for the input signal generated by a control unit during non-faulty operating conditions.

For at least one embodiment, a system for avoiding propagation of a fault between two or more safety components may be configured to operate when one of the first IC fault and the second IC fault comprises an open-circuit fault. Under such a scenario a fault may propagate when, under no-fault conditions, an input impedance of a presently faulting first IC is used, at least in part, to transform the current for the input signal, as provided to the second, non-faulting IC, into a desired input voltage for the second IC. Accordingly and per at least one embodiment of the present disclosure, a voltage potential of an input signal provided to a non-faulting safety component is between twenty five percent (25%) and one-hundred percent (100%) of an output voltage potential for the input signal generated by a control unit during non-faulty operating conditions.

For at least one embodiment, a system for avoiding propagation of a fault between two or more safety components may be configured for use with a motor vehicle safety system, a vehicle air bag system, a self-driving vehicle system, a vehicle lane keeping assist system, and a vehicle automated braking system.

For at least one embodiment, a system for avoiding propagation of a fault to a safety component may be configured to prevent a second IC fault arising with respect to a second safety component from propagating, via an input signal, to a first safety component such that continued operation of a vehicle system in a fail functional mode of operation is facilitated.

For at least one embodiment, a system for avoiding propagation of a fault to a safety component may be configured for use in vehicle system that is at least one of a motor vehicle system, a vehicle air bag system, a self-driving vehicle system, a vehicle lane keeping assist system, and a vehicle automated braking system.

For at least one embodiment, a system for avoiding propagation of a fault between two or more safety components may be configured for use in an aircraft system.

In accordance with at least one embodiment of the present disclosure, a package for use in avoiding fault propagation in a safety system may include a socket configured to receive a die pin. The die may include a control unit integrated circuit. The package may further include a first output pin first electrically coupling the die pin, via the socket, to a first safety component and a second output pin second electrically coupling the die pin, via the socket, to a second safety component. For at least one embodiment, each of the first safety component and the second safety component may be configured to receive a control signal from the control unit via the die pin and, respectively, the first output pin and the second output pin.

In accordance with at least one embodiment of the present disclosure, a package for use in avoiding fault propagation in a safety system may further include an isolating member configured to electrically isolate a first output pin from a second output pin. The isolating member may be configured to prevent a fault arising with respect to one of a first safety component and a second safety component from propagating, via a socket, provided in the package, to the other safety component.

In accordance with at least one embodiment of the present disclosure, a package for use in avoiding fault propagation in a safety system may include an isolating member that is a current isolating member.

In accordance with at least one embodiment of the present disclosure, a package for use in avoiding fault propagation in a safety system may include an isolating member configured as a single isolating member configured to provide an impedance of at least three times a common impedance that would arise between the die pin and each of the first output pin and the second output pin absent use of the single isolating member.

In accordance with at least one embodiment of the present disclosure, a package for use in avoiding fault propagation in a safety system may include a socket configured to split a control signal into a first control signal provided to a first safety component via a first control signal connection and a second control signal provided to a second safety component via a second control signal connection.

In accordance with at least one embodiment of the present disclosure, a package for use in avoiding fault propagation in a safety system may include an isolating member configured to prevent a fault arising relative to a first control signal connection used with a first safety component from propagating to a second safety component. For at least one embodiment, the isolating member may be configured to prevent a fault arising relative to the second control signal connection used with the second safety component from propagating to the first safety component.

In accordance with at least one embodiment of the present disclosure, a method for mitigating propagation of a fault from a first safety component to a second safety component may include isolating at least one of first input signal from second input signal. For at least one embodiment, each of the first input signal and the second input signal may arise from a common input signal electrically output by a control unit for respective use by each of a first safety component and a second safety component. For at least one embodiment, the first input signal may be electrically provided to the first safety component and the second input signal may be electrically provided to the second safety component.

In accordance with at least one embodiment of the present disclosure, a method for mitigating propagation of a fault from a first safety component to a second safety component may include isolating, by use of a first impedance, a first current provided in a first input signal from a second current provided in a second input signal.

In accordance with at least one embodiment of the present disclosure, a method for mitigating propagation of a fault from a first safety component to a second safety component may include isolating, by use of a diode, a first voltage provided in a first input signal from a second voltage provided in a second input signal.

BRIEF DESCRIPTION OF THE DRAWINGS

The features, aspects, advantages, functions, modules, and components of the devices, systems and processes provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

DETAILED DESCRIPTION

The various embodiments described herein are directed to devices, systems and methods for avoiding fault propagation and dependent failure initiation in safety systems.

Figure 1:
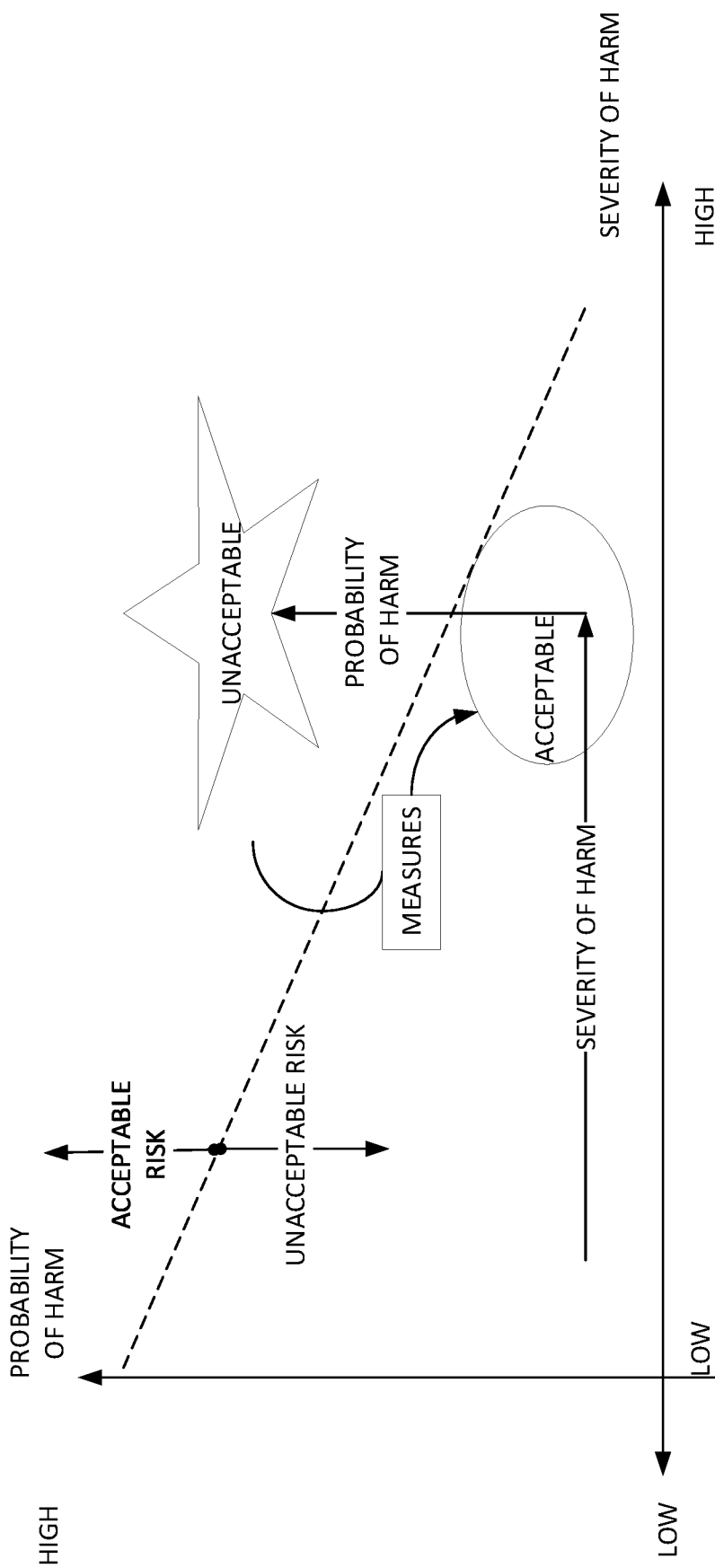
FIG. 1 is a graph illustrating a known probability of harm versus a severity of harm representation that may be used in assessing hazard risks associated with a vehicle system.
Figure 2:
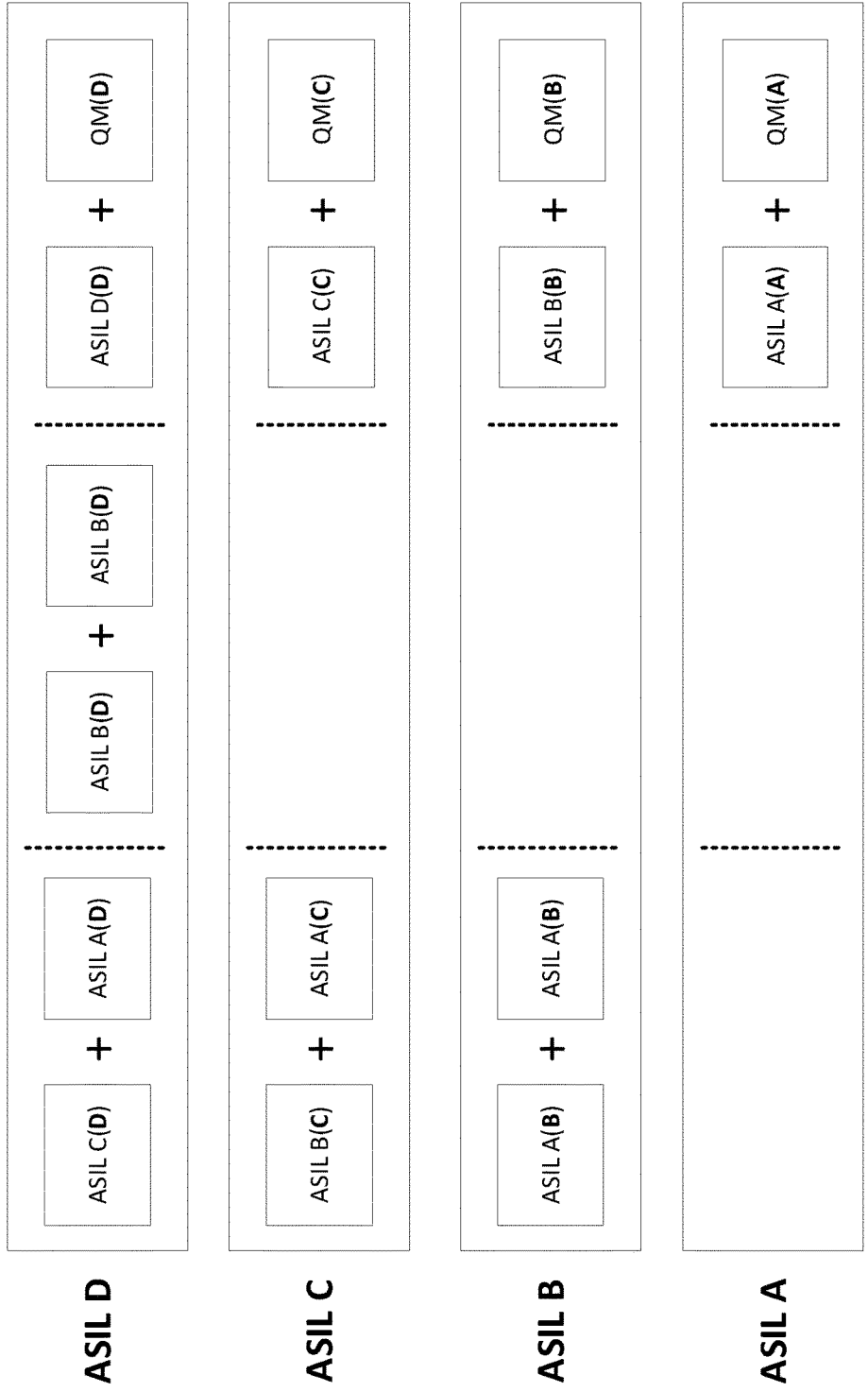
FIG. 2 is a graphical representation of a known ASIL decomposition that may be used to reduce hazard risks associated with a vehicle system.
Figure 3:
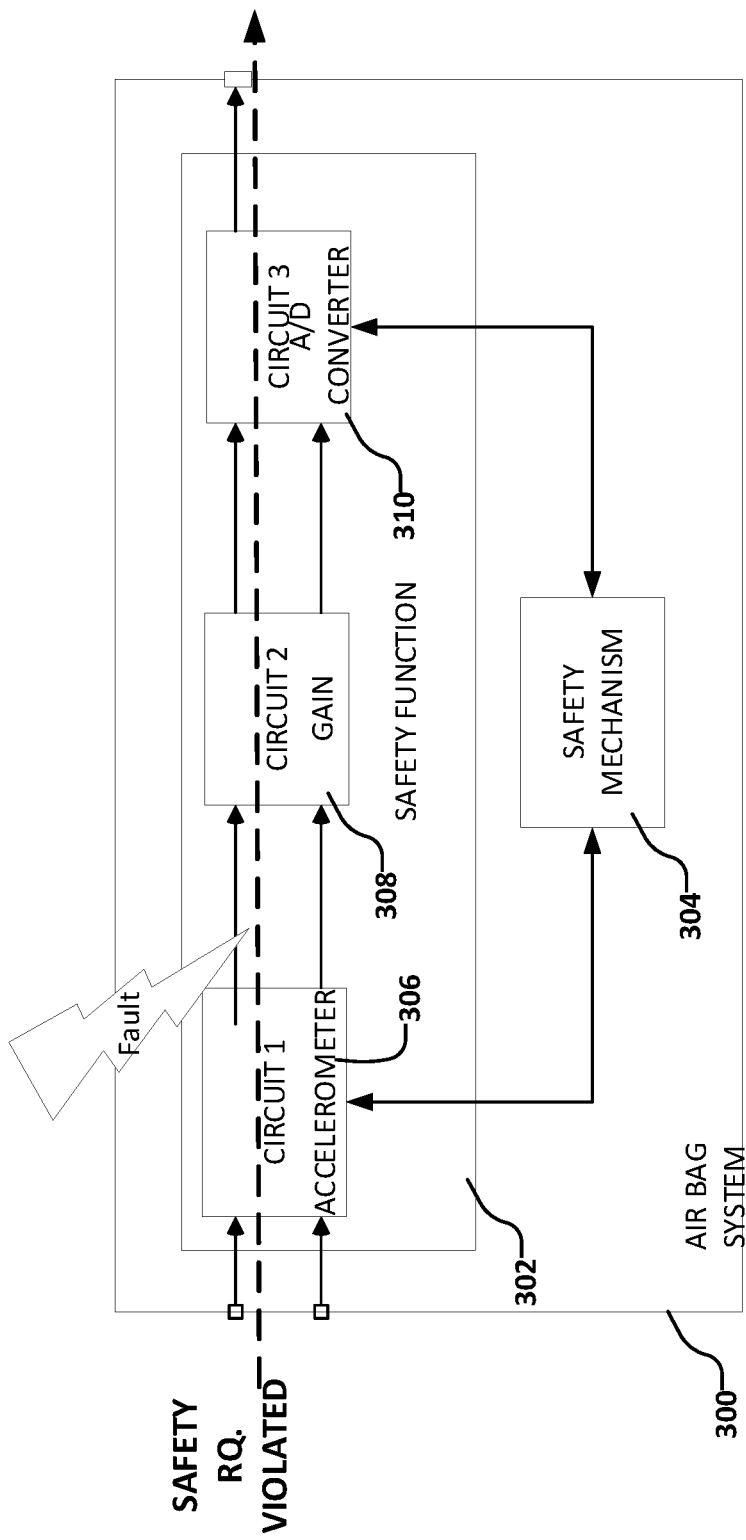
FIG. 3 is an illustrative representation of relationships between vehicle systems, safety functions and safety mechanisms.
Figures 4A, 4B:
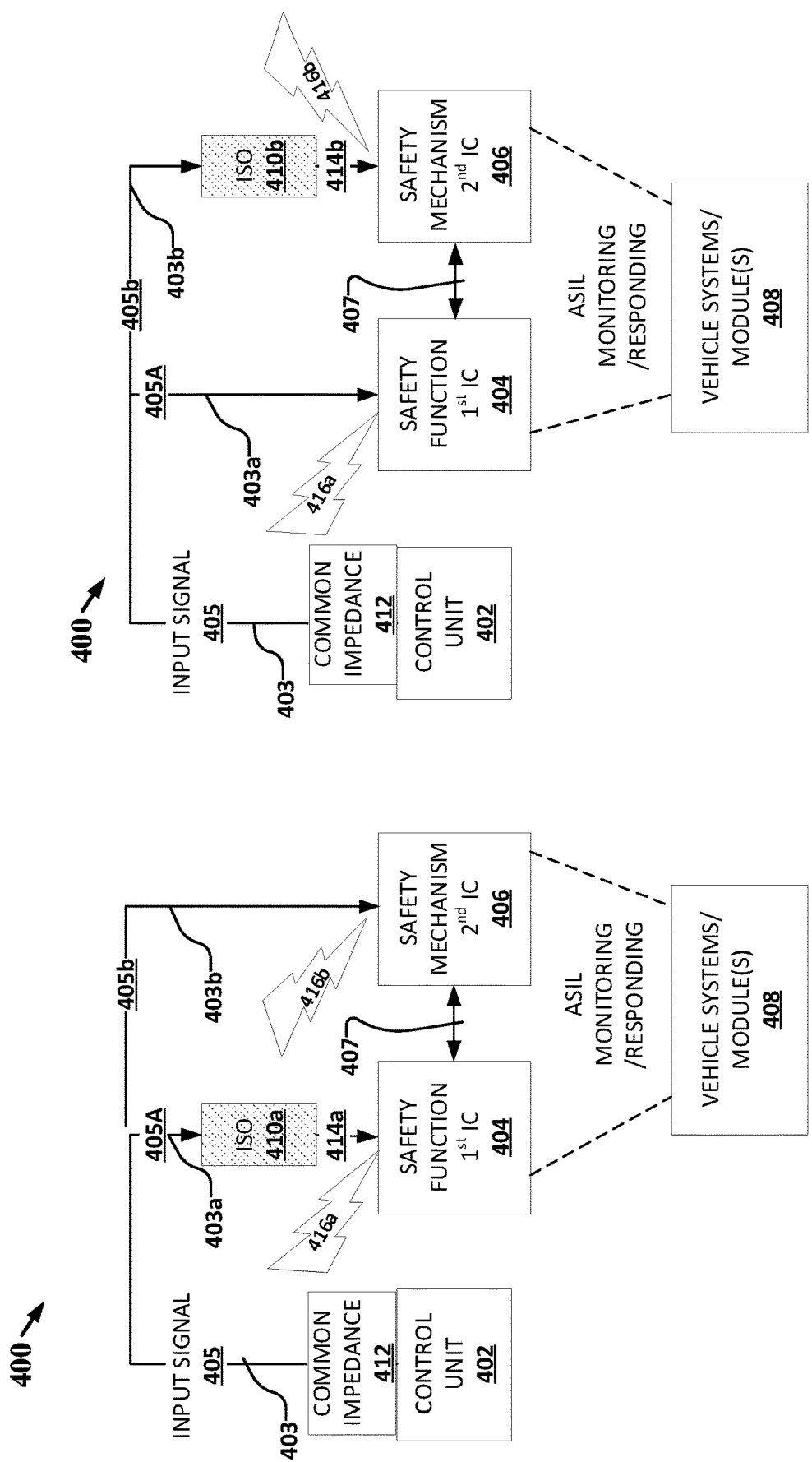
FIG. 4A is a schematic representation of a first system for use in preventing a propagating of faults between two or more safety components and in accordance with at least one embodiment of the present disclosure.
FIG. 4B is a schematic representation of a second system for use in preventing a propagating of faults between two or more safety components and in accordance with at least one embodiment of the present disclosure.
Figures 4C, 5:
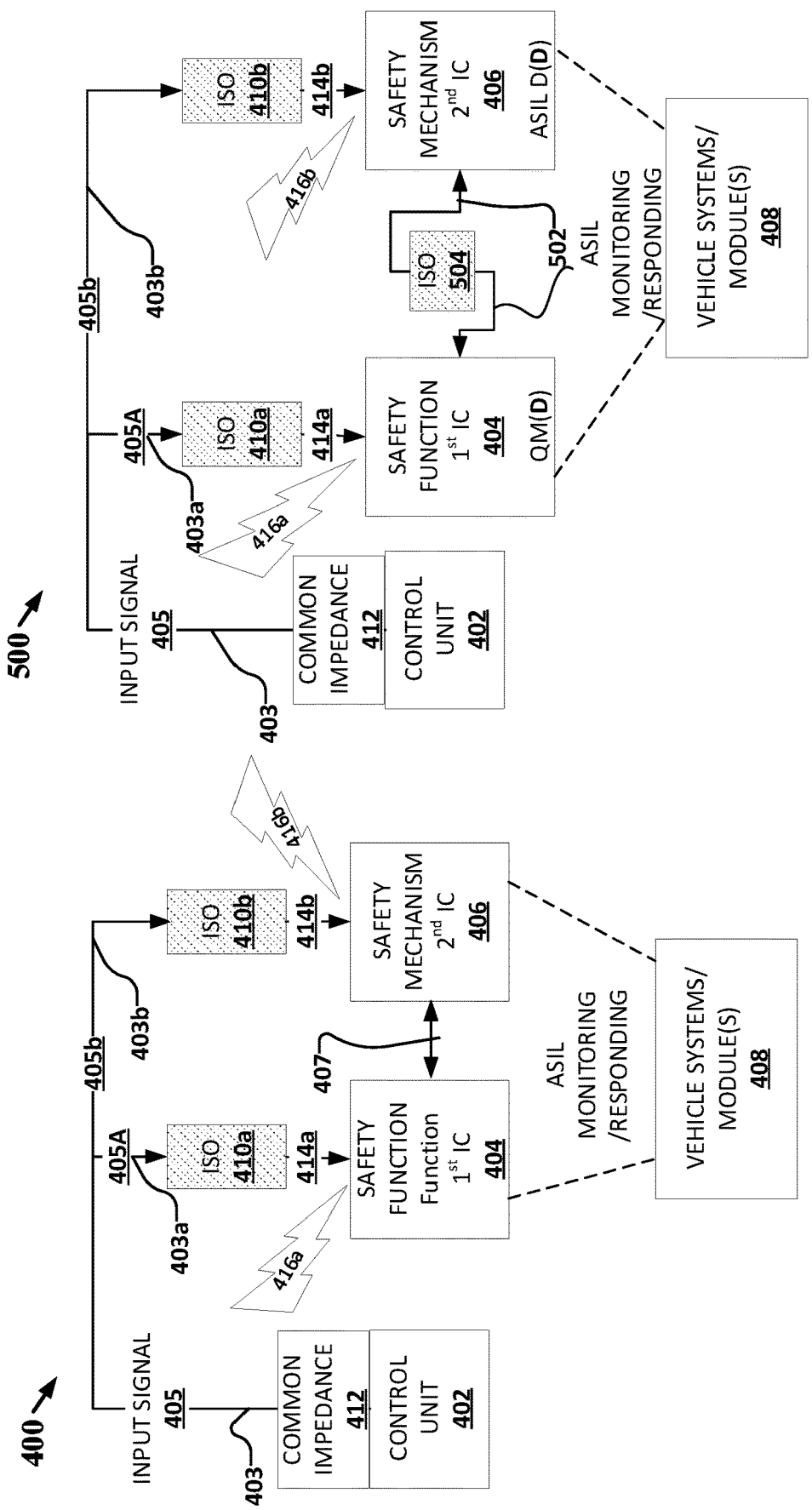
FIG. 4C is a schematic representation of a third system for use in preventing a propagating of faults between two or more safety components and in accordance with at least one embodiment of the present disclosure.
FIG. 5 is a schematic representation of a fourth system for use in preventing a propagating of faults between two or more safety components, while further providing for ASIL decomposition, and in accordance with at least one embodiment of the present disclosure

As shown in FIGS. 4A to 4C, for at least one embodiment of the present disclosure, a system 400 for preventing DFIs between two or more safety components includes a first control unit 402 electrically coupled by a common lead 403 to each of a safety function, provided by a first IC 404, and a safety mechanism, provided by a second IC 406. Herein, the term "control unit" includes any electronic circuit or device that provides an input signal to the safety component. Non-limiting examples of a "control unit" include a device providing a bias current, an LVDS transmitter, and a master control unit. Herein, the terms "safety function" and "first IC" are used interchangeably to refer to the one or more components providing a desired safety function in furtherance of satisfying a safety goal. Similarly, the terms "safety mechanism" and "second IC" are used interchangeably to refer to one or more components providing monitoring of one or more safety functions. As shown, the safety function 404 and safety mechanism 406 are electrically and/or communicatively coupled by monitoring link 407 to facilitate monitoring, and the like, of the safety function 404 by the safety mechanism 406.

The safety function 404 and safety mechanism 406 may be provided to monitor one or more vehicle systems/modules 408 and provide for compliance with a safety goal, such as an ASIL safety goal, as specified for such one or more vehicle systems/modules 408. Any desired configuration of the first IC 404 and second IC 406 relative to the common lead provided by the control unit 402 may be utilized.

The common lead 403 may be utilized to provide a common input, power and/or control signal (herein, individually and collectively each an "input signal" 405) to each of the first IC 404 and the second IC 406. For at least one embodiment, the input signal 405 is provided using a common lead 403. The common lead 403 is split into parallel leads by first common lead 403a and second common lead 403b, which are respectively coupled to each of the first IC 404 and the second IC 406. The input signal 405 is thus provided as a first input signal 405a and a second input signal 405b. Non-limiting examples of an input signal 405 include enable signals, clock signals, reset signals, power, reference voltages, bias currents, data signals, and the like.

For at least one embodiment, a common impedance 412 arises between the common lead 403 and the control unit 402. The common impedance 412 may be utilized to regulate currents in the input signal 405, as provided by the control unit 402 to each of the safety function/first IC 404 and the safety mechanism/second IC 406.

As discussed further herein, the common impedance 412 may be coupled with one or more isolating components, such as first isolating component 410a and second isolating component 410b (FIG. 4B) to avoid a first IC fault 416a from propagating to the $2^{nd}$ IC 406 and to avoid a second IC fault 416b from propagating to the $1^{st}$ IC 404. When an isolating component is present in the system 400, an isolating lead 414 couples a given safety component with the isolating component. More specifically, in FIGS. 4A and 4C, a first isolating lead 414a couples the first IC 404 with the first isolating component 410a and, in FIGS. 4B and 4C, a second isolating lead 414b couples the second IC 406 with the second isolating component 410b.

For at least one embodiment where the input signal 405 is commonly provided within a 0.1V to 1V range, the common impedance 412 may be an impedance of 100 to 300 Ohms, the isolation impedance of each of the first isolating component 410a and the second isolating component 410b are three times (3×) the common impedance. For at least one embodiment where a short to ground is generating a given fault, the isolating impedance for a given, faulty safety component results in an input voltage to the non-faulting safety component that is within 75-100% of the output voltage from the MCU 402. Similarly, for another embodiment where a short to supply is generating a given fault, the isolating impedance for a given, faulting safety component results in an input voltage to the non-faulting safety component that is within 0-25% of the output voltage from the MCU 402.

As shown in FIG. 4A and for at least one embodiment, the system 400 may also include a first isolating component 410a. As shown in FIG. 4B and for at least one embodiment, the system may include use of the second isolating component 410b. As shown in FIG. 4C and for at least one embodiment, each of the first isolating component 410a and the second isolating component 410b may be used.

For at least one embodiment a failure of an isolating component does not impact the SPFM associated with a given safety goal. For at least one embodiment, a fault on the first isolating component 410a and/or second isolating component 410b may result in minimal, if any latent fault contribution. The low impact on the safety metrics by adding the isolator can be understood by studying possible faults into the isolating component itself, such as by forming a short circuit or an open circuit, the short circuit fault will have a negligible impact on the safety component and the open circuit fault will be readily detectable. More specifically, for the short circuit condition, the safety component will operate in the same manner as if the isolator was not present. For the open circuit condition, the normal operation of the safety component associated with the faulting isolating component will be impacted. But, the failure of that isolating component will be detectable, such that the system can so detect and enter into an appropriate safe state with negligible impact, if any, on the SPF or the LFM. In addition to this, adding the isolator has no impact on the fault free functional operation due to the added impedance of an isolating component being minimal, in view of a total impedance for a given circuit connection under no-fault conditions. For example and when a fault condition is not arising, the common impedance 412 may be, e.g., three-hundred Ohms (300Ω), the first isolating component 410a may provide an impedance of one thousand ohms (1 KΩ), and an input impedance for the safety function 404 may be ten thousand ohms (10 KΩ). This results in the additional impedance arising from use of the first isolating component 410a being less than ten percent (10%) of the total impedance of a circuit formed by the common lead 403 and the first common lead 403a.

For at least one embodiment, the first isolating component 410a and/or second isolating component 410b may include one or more current isolating components. For at least one embodiment, the current isolating components may include resistors. For at least one embodiment, the resistors used in the first current isolating component 410a and/or the second current isolating component 410b provide a respective first impedance and a second impedance. For at least one embodiment, the first impedance and the second impedance are substantially identical. For at least one embodiment, the first impedance and the second impedance are different. For at least one embodiment, the first impedance and the second impedance each provide an impedance that is at least three times (3×) larger than the common impedance.

For at least one embodiment, the one or more first isolating component 410a and second isolating component 410b are voltage isolating components. For at least one embodiment, the voltage isolating components include diodes. For at least one embodiment, the one or more voltage isolating components inhibit an over-voltage or under-voltage fault condition arising in a first one of the first IC 404 and the second IC 406 from propagating to the other IC. For at least one embodiment, the one or more voltage isolating components inhibit a change in voltage in the input signal 405 of greater than 0 to 50% (an over voltage condition) and/or lesser than 0 to 50% (an under voltage condition) of the expected voltage.

For at least one embodiment and when a fault condition is not occurring, each of the first input signal 405a, on the first common lead 403a and the second input signal 405b, on the second common lead 403b have substantially identical voltages and currents. Accordingly, it is to be appreciated that use of the first isolating component 410a and/or second isolating component 410b prevents a fault arising, for example, at the first IC 404 propagating across the first common lead 403a and the second common lead 403b to the second IC 406, and vice versa.

For at least one embodiment, by including in the system 400 one or more of the first isolating component 410a and/or the second isolating component 410b, a fault arising at either of the first IC 404 or the second IC 406 will not propagate to the respective other, non-faulting IC. It is to be appreciated that a voltage divider circuit is effectively formed by use of one or more of the first isolating component 410a and the second isolating component 410b, in conjunction with the common impedance 412. The voltages provided to a safety component under fault and no-fault conditions are thus readily calculatable by a person having ordinary skill in the art using known principles. For example and referring to FIG. 4A, a target may be to provide a given input signal 405 at a first given level, such as a "HIGH-level" (e.g., when the IO supplies a 3V signal) to both the first IC 404 and the second IC 406. When a fault condition arises (e.g., short to ground) at the second IC 406, the voltage divider circuit formed by the common impedance 412 and second isolating component 410b result in the voltage provided to the first IC 404 being reduced by only 25% (when the first isolating component is three times (3×) the common impedance and the short impedance to ground is 0 Ohm). Such a reduced voltage provided to the first IC 404 is desirably sufficient for the first IC 404 to interpret the first input signal 405a as being at a HIGH-level for intended uses thereof by the first IC 404. Similarly, a target may be to provide a given input signal 405 at a second given level, such as at a "LOW-level" (e.g., when the IO supplies a 0V signal) to both the first IC 404 and the second IC 406. When a fault condition arises (e.g., a short to supply) at the second IC 406, the voltage divider circuit formed by the common impedance 412, and second isolating component 410b result in the voltage provided to the first IC 404 being limited to an increase of twenty-five percent (25%) and thus, provided at a voltage which the first IC 404 will interpret as being at a LOW-level.

As shown in FIG. 5 and for at least one embodiment of the present disclosure, a system 500 may include use of a third isolating component 504 providing isolation between one or more monitoring links 502 or other links, such as a power link, electrically coupling the first IC 404 with the second IC 406. It is to be appreciated that the combination of the third isolating component 504 and one or more of the first isolating component 410a and second isolating component 410b may facilitate decomposition of the safety components. For example, when the first IC 404 has a QM (D) rating and the second IC 406 has an ASIL D(D), since the first IC 404 and the second IC 406 are independently provided and isolated by the first, second and third isolating components 410a/410b/504, the combined safety component satisfies the Standard by use of decomposition.

Further, it is to be appreciated that a first IC fault 416a will not affect operations provided by the second safety component, as the second input signal 405b is not significantly affected by the first IC fault 416a, as received by the second IC 406, the non-faulting safety component. More specifically, the voltage divider principles discussed above, can also be used to avoid a first IC fault arising, e.g., with respect to a safety function from propagating to a second IC providing, e.g., a safety mechanism. The first isolating component 410a enables the second IC 406/safety mechanism to continue to operate properly, detect the failure of the safety function, and output a corresponding error signal to an appropriate system controller. When redundant systems are provided, it is to be appreciated that use of one or more isolating components, in accordance with an embodiment of the present disclosure, may be used to facilitate "fail functional" principles of operation. Accordingly and for at least one embodiment, a fault arising with respect to a safety function in a first safety system A will not affect whether a vehicle system detects such fault and fails over to a fully redundant second safety system B and thereby provides a fail functional method of operation.

Accordingly, per the system of one or more of FIGS. 4A to 4C and FIG. 5, a fault in a first safety component will not propagate to a second safety component and a Standard compliant safety component may be provided without decomposition (as per FIGS. 4A to 4C) or with decomposition (as per FIG. 5). Accordingly, "fail safe" and "fail functional" principles of operation for a vehicle system are furthered by one or more embodiments of the present disclosure.

Figure 6:
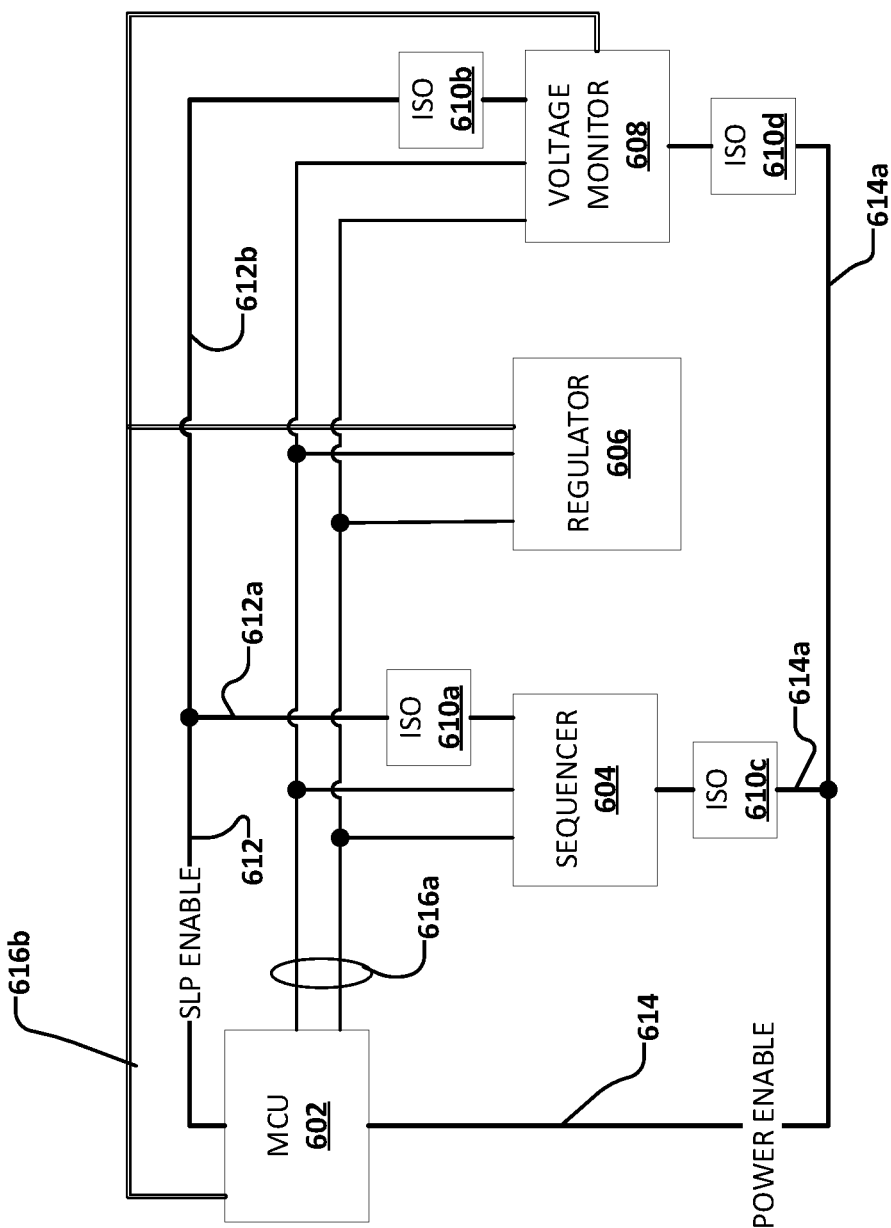
FIG. 6 is a schematic representation of a fifth system for use in preventing a propagating of faults between two or more safety components and in accordance with at least one embodiment of the present disclosure.

As shown in FIG. 6, a non-limiting example of an implementation of an embodiment of the present disclosure is provided. For this non-limiting example, a safety component may include a master control unit (MCU) 602 that is electrically coupled to two or more of a sequencer 604, a regulator 606, and a voltage monitor 608. One or more isolating components 610a-d, such as first isolator (ISO) 610a, second isolator 610b, third isolator 610c and fourth isolator 610d, may be used to provide current isolation and/or voltage isolation between two or more of the sequencer 604, regulator 606, and voltage monitor 608.

More specifically, one or more of the first isolator 610a and the second isolator 610b may be provided to prevent faults from propagating between the sequencer 604 and the voltage monitor 608 across a sleep ("SLP") enable connection 612, which is provided in parallel to each of the sequencer 604 and the voltage monitor 608 using a first SLP enable connection 612a and a second SLP enable connection 612b. For at least one embodiment and when a fault condition is not occurring, an enable signal on each of the first SLP enable connection 612a and the second SLP enable connection 612b may have substantially identical voltages and currents—this is often due to large input impedances (e.g., >10K Ohms) arising at each component as compared with an impedance (e.g., ~300 Ohms) associated with a given control signal. Accordingly, it is to be appreciated that use of the first isolator 610a prevents a fault arising, for example, at the sequencer 604 from propagating across the first enable connection 612a and the second enable connection 612b to the voltage monitor 608. Likewise, the second isolator 610b prevents a fault arising, for example, at the voltage monitor 608 from propagating across the second enable connection 612b and the first enable connection 612a to the sequencer 604. It is to be appreciated that the SLP enable connection 612 and sub-elements thereof 612a/612b may be used to provide any desired signal or signals. It is also to be appreciated that any of the embodiments of FIGS. 4A to 4C may be used in providing one or more of the first isolator 610a and/or the fourth isolator 610b.

Similarly and as further shown in FIG. 6, one or more of the third isolator 610c and the fourth isolator 610d may be provided to prevent faults from propagating between the sequencer 604 and the voltage monitor 608 across a power enable connection 614, which is provided in parallel to each of the sequencer 604 and the voltage monitor 608 using a first power enable connection 614a and a second power enable connection 614b. For at least one embodiment and when a fault condition is not occurring, a power enable signal on each of the first power enable connection 614a and the second power enable connection 614b may have substantially identical voltages and currents—this is often due to large input impedances (e.g., >10K Ohms) arising at each component as compared with an impedance (e.g., ~300 Ohms) associated with a given control signal. Accordingly, it is to be appreciated that use of the third isolator 610c and/or the fourth isolator 610d prevents a fault arising, for example, at the sequencer 604, from propagating across the first power enable connection 614a and the second power enable connection 614b to the voltage monitor 608, and vice versa. It is to be appreciated that the power enable connection 614 and sub-elements thereof 614a/614b may be used to provide any desired signal or signals. It is also to be appreciated that any of the embodiments of FIGS. 4A to 4C may be used in providing one or more of the third isolator 610c and/or the fourth isolator 610d.

As further shown in FIG. 6, one or more third connections 616 may be provided between the MCU 602 and one or more of the sequencer 604, second controller 606, and voltage monitor 608. For at least one embodiment, such one or more third connections 616a-616b, such as a communications line or bus, may not need to be fault isolated because of the voltages and/or currents provided therebetween, the use of redundancy checks, such as cyclic redundancy checks, fail safe components, and otherwise. Accordingly, it is to be appreciated that isolators may be used in accordance with at least one embodiment of the present disclosure with respect to those common connections subject to fault propagation risks and may not be used with respect to other common connections that are not subject to faults propagating and/or where the system is configured to continue to operate (fail functional) even when a fault propagates through the system.

For at least one embodiment, one or more of the MCU 602, sequencer 604, second controller 606, voltage monitor 608, and isolators 610a-d may be a component provided by ON Semiconductors of Phoenix, Ariz. or one of its affiliates.

Figure 7:
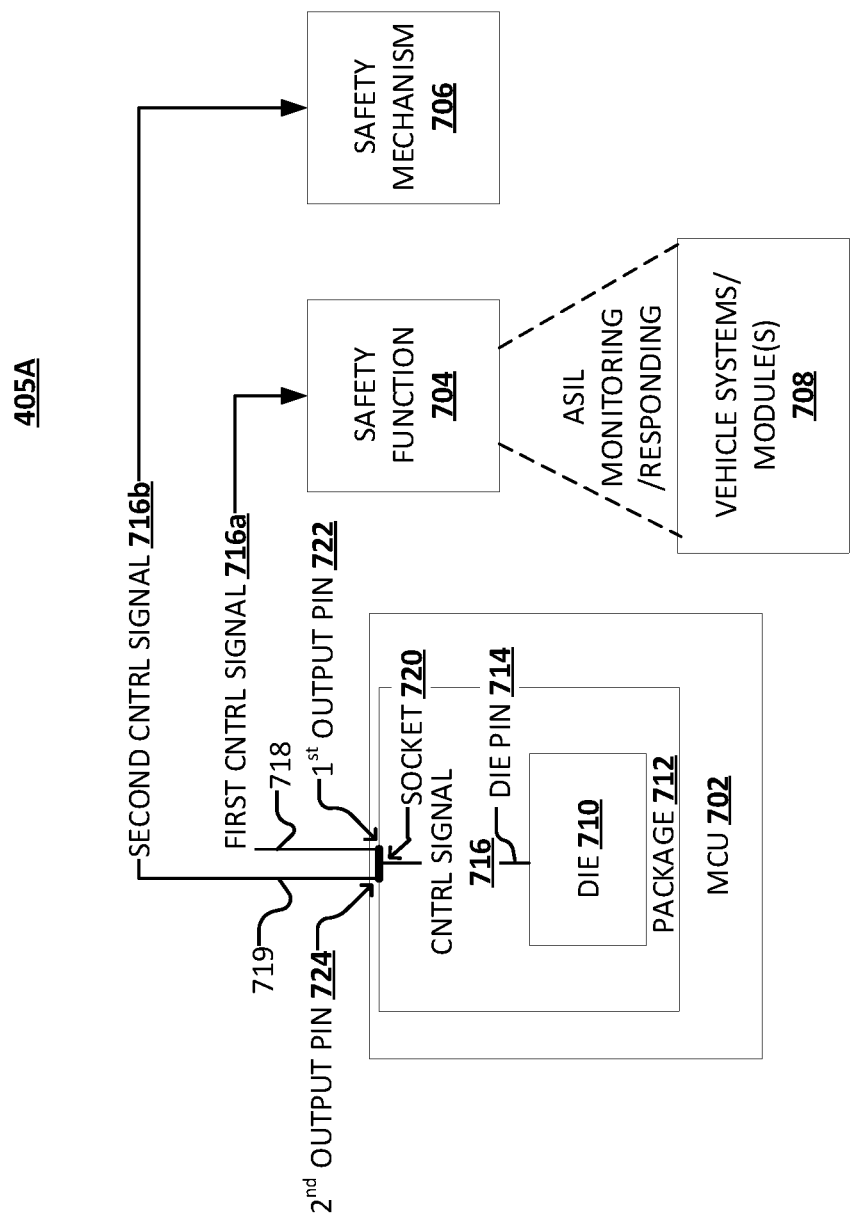
FIG. 7 is a schematic representation of a sixth system for use in preventing a propagating of faults between two or more safety components and in accordance with at least one embodiment of the present disclosure.

As show in FIG. 7, another embodiment of a system 700 for use in preventing dependent failure initiators from propagating faults between two or more safety components includes an MCU 702 that is electrically connected to a safety function 704 and a safety mechanism 704. The safety function 704 and safety mechanism 706 collectively providing a safety component. The safety component is provided for use with one or more vehicle systems/modules 708. As shown the MCU 702 further includes a die 710 and a package 712. The die includes at least one pin 714 (or other known connector) used to output at least one signal, such as a control signal 716. The control signal 716 is provided to the safety function 704 and safety mechanism 706 as identical first and second control signals 716a and 716b by respectively via first control signal connection 718a and second control signal connection 718b. It is to be appreciated that the "control signal" may be any signal and the use of "control" is used herein for identification purposes only.

As further shown in FIG. 7, the package 712 includes a socket 720 that has been configured, in accordance with an embodiment of the present disclosure, to include a first output pin 722 and a second output pin 724. That is, instead of a single pin being used to connect the MCU 702 with both the safety components, two pins (first output pin 722 and second output pin 724) are used and are respectively coupled to the first control signal connection 718 and the second control signal connection 719. It is to be appreciated that each of the first pin 722 and the second pin 724 may be configured such that the package 712 provides for current and/or voltage isolation between such pins and such that a fault arising with respect to the safety function 704 does not propagate across the first control signal connection 718, first pin 722 and socket 720 to the second pin 724, second control signal connection 719 and to the safety mechanism 706, or visa-versa. Using such an embodiment, it is to be appreciated that a single isolating member (such as a current isolating and/or voltage isolating component) (not shown) may be used at the socket 720 to provide isolation between the first pin 722 and the second pin 724, and thereby between safety components, with respect to at least the signals commonly provided to both such safety components.

It is to be further appreciated that ASIL decomposition, as described herein with respect to the embodiment of FIG. 5 may also be provided by replicating the redundant pin embodiment of FIG. 7 with respect to each connection commonly shared by two or more safety components and another vehicle component, such as an MCU or otherwise.

It is further to be appreciated that by use of the embodiment of FIG. 7 as modified or not modified to facilitate ASIL decomposition, existing configurations of safety components, as for example, provided on one or more system on a chip, circuit board, or otherwise (herein, collectively, "circuits") do not need to be modified to include additional components, such as resistors, diodes or the like, to provide current and/or voltage isolation between safety components. Instead, such circuits need only be modified to include one or more second, separate connections for those otherwise singular connections commonly shared by two or more safety components, such connections being subject to fault propagation concerns. Such, second separate connections being configured for coupling with a modified package to include redundant pins for the otherwise singularly shared connection of prior art embodiments. Any current and/or voltage isolating components are instead provided by a modified package, such as the package 712 of FIG. 7.

In accordance with at least one embodiment of the present disclosure, a device may be configured to practice any of the above described embodiments of the present disclosure. Such a device may be configured as a system on a chip, or otherwise. For the embodiment of FIG. 7, a device according to the present disclosure may include a package configured to have duplicate pins (or similar connecting structures) that are current and/or voltage isolated within the package itself.

In accordance with at least one embodiment of the present disclosure, a method for avoiding propagation may include one or more operations including isolating an input signal provided to a first safety component when a fault arises with respect to a second safety component, wherein each of the first safety component and the second safety component are provided the input signal using, at least in part, a common lead coupled with a control unit. Per such methodology and in accordance with at least one embodiment of the present disclosure, fault propagation may be avoided between first and second safety components, even though they are electrically coupled to each other via the common lead, by use of one or more current isolation components and/or one or more voltage isolation components. The current isolation components and/or voltage isolation components may be located between a given safety component and a junction at which the common lead is provided to each of the first safety component and the second safety component.

For at least one embodiment of such a method, each of the safety components may, during non-faulty operations, be configured to receive the common input signal. A fault, when arising with respect to one safety component, may affect at least one property of the common input signal, such as its voltage potential and/or current. Absent use of an isolating member providing current isolation and/or voltage isolation between the safety components, one or more properties of the common input signal, as received by the non-faulting safety component, will be affected by the fault condition.

Figure 8:
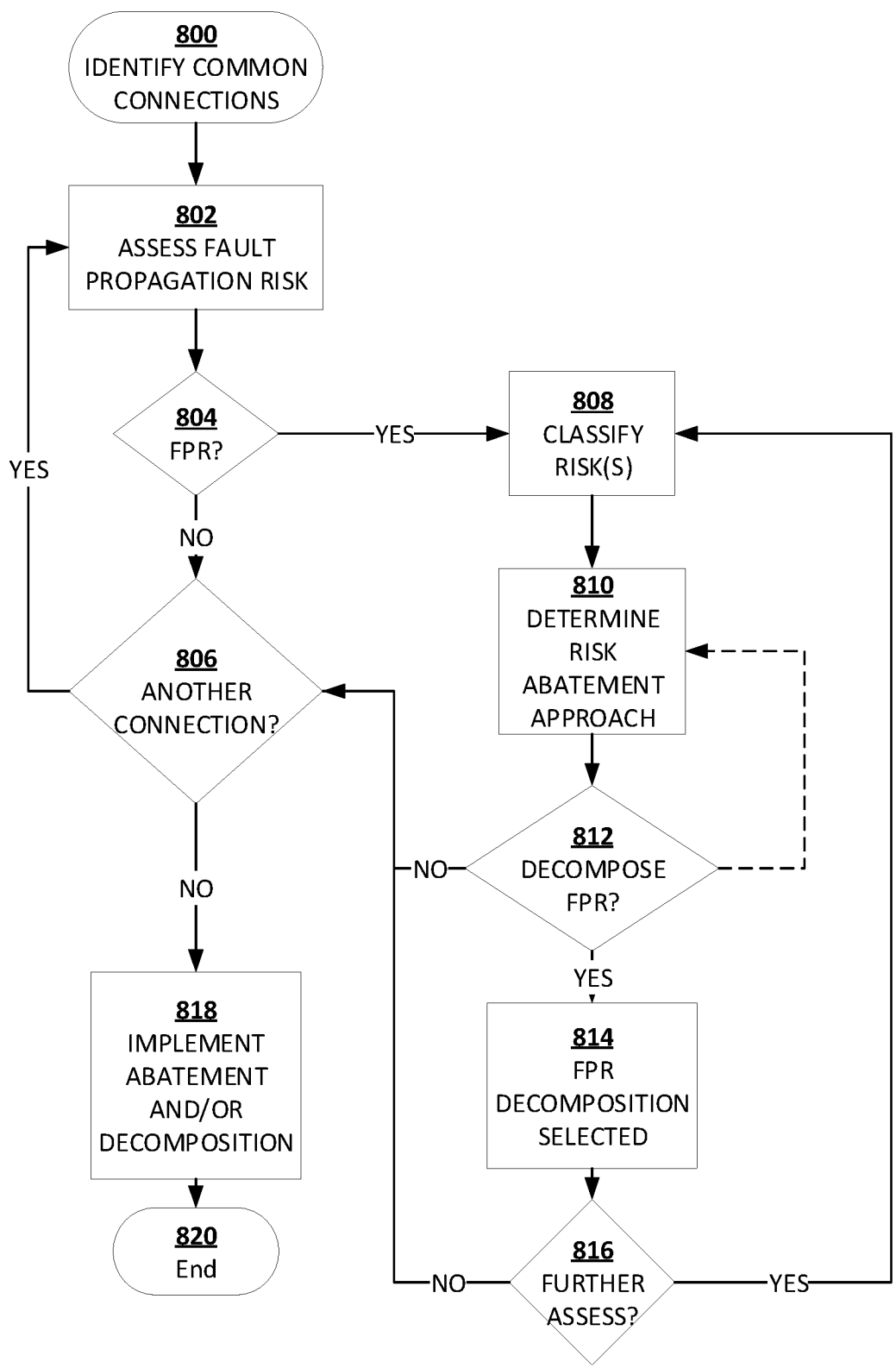
FIG. 8 is a flow chart for a method for use in preventing a propagating of faults between two or more safety components and in accordance with at least one embodiment of the present disclosure.

In accordance with at least one embodiment of the present disclosure and as shown in FIG. 8, a method for use in avoiding fault propagation and/or dependent failure initiation may include identifying one or more connections commonly shared by a first safety component and a second safety component with a third component (Operation 800). If an identification is made, an assessment of whether such common connections presents a fault propagation risk (FPR, also referred to in the Standard as a "coexistence") may be performed (Operation 802). If an FPR does not exist, the method may include assessing another connection (Operation 806). For at least one embodiment, all identified connections are assessed for an FPR.

Returning again to Operation 804, if an FPR exists for a given connection, the method may include classifying the FPR by type (Operation 808). For example, an FPR may present as a fault arising from current risk (such as one arising from a short or open circuit), a voltage risk (such as a risk arising from an over or under voltage condition), a timing risk (such as a risk arising from one safety component driving a clock signal or other mechanism at an undesired rate), or other risk, and/or a combination of one or more of the foregoing risks.

Based on the risk classification, as per Operation 808, the method may include determining a risk abatement approach to use (Operation 810). For example, a first risk abatement approach may involve use of a single isolating component or multiple isolating components, as described herein for example with respect to the embodiments of FIGS. 4A to 4C. Similarly, a risk abatement approach may include use of a package configured to provide multiple pins for use with separate connections between a common element and each of two or more safety components, as described herein for example with respect to the embodiment of FIG. 7. It is to be appreciated that various and/or numerous factors may be considered in identifying a given risk abatement approach to utilize with regards to abating an identified FPR. Non-limiting examples of such factors include available circuit space, power requirements, signal delay considerations, radio frequency signal mitigation considerations, and others. Accordingly, it is to be appreciated that the risk abatement approach to utilize will likely vary.

As per Operation 812, the method may include determining whether decomposition of the FPR is desired. It is to be appreciated that for one or more embodiments Operation 812 may be performed in conjunction with, in sequence with and/or in lieu of Operation 810. This relationship is illustrated in FIG. 8 by the dashed line connecting Operations 810 and 812.

As per Operation 814, the FPR decomposition to be used is selected. It is to be appreciated that the FPR decomposition may occur in accordance with any of the embodiments described above or otherwise. For example, decomposition may include the use of additional isolating components, as described above for example with respect to FIG. 5, by the providing of redundant systems/components, or otherwise.

As per Operation 816, the method may include determining whether further classification and/or determining of a risk abatement approach and/or a decomposition approach is needed for a given FPR. If "Yes", the method may continue with one or more of Operations 808, 810, 812 and 814. If "NO," the method may continue with Operation 806.

As per Operation 818, the method may include implementing the desired abatement and/or decomposition approaches selected. It is to be appreciated that such approaches may be implemented at any desired time of safety component fabrication, assembly, testing, use or otherwise and may be implemented using any known or later arising fabrication, assembly or other manufacturing approaches.

As per Operation 820, the method ends when those desired connections of concern for fault propagation and/or dependent failure initiation have been addressed.

It is to be appreciated that the operations described above and depicted in FIG. 8 are illustrative only and are not intended herein to occur, for all embodiments of the present disclosure, in the order shown, in sequence, or otherwise. One or more operations may be performed in parallel and operations may be not performed, as provided for any given use of an embodiment of the present disclosure.

It is to be appreciated that the principles of the various embodiments of the present disclosure described herein may be applied to non-safety related vehicle systems and components. For example, isolation may be provided between a safety related component and a non-safety related component. It is also to be appreciated that the principles of the various embodiments are not limited to vehicle systems and may be used in conjunction with other systems where independence of a first component is needed vis-à-vis a second component. Non-limiting examples of such other systems include aircraft and rail systems, industrial processes, and others.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes only and are not intended to be limiting to any orientation or configuration of any elements or sequences of operations for the various embodiments of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or"

are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:

1. A package, for use in avoiding fault propagation in a safety system, comprising:
   a single socket configured to receive a die pin for a die;
      wherein the die pin is coupled, directly via the socket, to a safety component comprising a safety function and a safety mechanism; and
      wherein the die includes a control unit integrated circuit outputting a first control signal on the die pin;
   the socket further comprising:
      a first output pin first electrically, directly and separately coupling the die pin to the safety function;
         wherein the safety function is configured to receive the control signal from the control unit via the die pin and the first output pin; and
      a second output pin second electrically, directly and separately coupling the die pin to the safety mechanism;
         wherein the safety mechanism is configured to receive the control signal from the control unit via the die pin and the second output pin; and
      an isolating member electrically isolating, on the socket, the first output pin from the second output pin; and
         wherein the isolating member prevents a fault arising with respect to one of the safety function and the safety mechanism from propagating, via the socket, to another of the safety function and the safety mechanism.

2. The package of claim 1,
wherein the isolating member is a current isolating member.

3. The package of claim 2,
wherein the isolating member is a single isolating member configured to provide an impedance of at least three times a common impedance that would arise between the die pin and each of the first output pin and the second output pin absent use of the single isolating member.

4. The package of claim 1,
wherein the socket is configured to split the control signal into a first control signal provided to the safety function via a first control signal connection coupled to the first output pin and a second control signal provided to the safety mechanism via a second control signal connection coupled to the second output pin.

5. The package of claim 4,
wherein the isolating member prevents a first IC fault arising relative to the first output pin from propagating to the safety mechanism; and
wherein the isolating member prevents a second IC fault arising relative to the second output pin from propagating to the safety function.

6. A system, comprising:
a control unit outputting an input signal to a safety component via a common lead;
wherein a common impedance arises between the control unit and the common lead;
wherein the safety component comprises:
   a safety function;
   a safety mechanism;
   an isolating component; and
   an isolating lead;
   wherein and within the safety component, the common lead is split, in a parallel circuit configuration, into a first common lead and a second common lead;
wherein the control unit is coupled to the isolating component by the common impedance, the common lead and the first common lead;
wherein the control unit is coupled to the safety mechanism by the common impedance, the common lead and the second common lead;
wherein the isolating component is coupled to the safety function by the isolating lead; and
wherein the isolating component prevents a first fault arising with respect to the safety function from propagating, via the first common lead and the second common lead, to the safety mechanism.

7. The system of claim 6,
wherein the isolating component includes a current isolating component.

8. The system of claim 6,
wherein the isolating component includes a voltage isolating component.

9. The system of claim 6, further comprising:
a second isolating component electrically disposed between and further coupling the control unit with the safety mechanism; and
wherein the second isolating component prevents a second fault arising with respect to the safety mechanism from propagating, via the common lead, to the safety function.

10. The system of claim 9,
wherein each of the isolating component and the second isolating component are current isolating components having substantially identical impedances.

11. The system of claim 9,
wherein a first fault results in an insubstantial change in the input signal as provided to the safety mechanism; and
wherein the second fault results in an insubstantial change in the input signal as provided to the safety function.

12. The system of claim 9,
wherein at least one of first fault and the second fault comprises one of a short-circuit fault and an open-circuit fault.

13. The system of claim 12,
wherein during the first fault, a voltage potential reduction of the input signal provided to the safety mechanism is between seventy-five percent (75%) and one-hundred percent (100%) of an output voltage potential for the input signal generated by the control unit during non-faulty operating conditions.

14. The system of claim 12,
wherein during the second fault, a voltage potential of the input signal provided to the safety function is between twenty-five percent (25%) and one-hundred percent (100%) of an output voltage potential for the input signal generated by the control unit during non-faulty operating conditions.

15. The system of claim 6,
wherein the system is for use with at least one of a motor vehicle safety system, a vehicle air bag system, a self-driving vehicle system, a vehicle lane keeping assist system, and a vehicle automated braking system.

16. The system of claim 6,
wherein prevention of a second IC fault arising with respect to the safety mechanism from propagating, via the input signal, to the safety function facilitates continued operation of a vehicle system in a fail functional mode of operation.

17. The system of claim 16,
wherein the vehicle system is at least one of a motor vehicle safety system, a vehicle air bag system, a self-driving vehicle system, a vehicle lane keeping assist system, and a vehicle automated braking system.

18. The system of claim 16,
wherein the vehicle system is an aircraft system.

* * * * *